US007917884B2

(12) United States Patent
Baumgartner et al.

(10) Patent No.: US 7,917,884 B2
(45) Date of Patent: Mar. 29, 2011

(54) ENHANCED VERIFICATION BY CLOSELY COUPLING A STRUCTURAL OVERAPPROXIMATION ALGORITHM AND A STRUCTURAL SATISFIABILITY SOLVER

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 588 days.

(21) Appl. No.: 12/013,191

(22) Filed: Jan. 11, 2008

(65) Prior Publication Data

US 2008/0109776 A1     May 8, 2008

Related U.S. Application Data

(63) Continuation of application No. 11/340,477, filed on Jan. 26, 2006, now Pat. No. 7,356,792.

(51) Int. Cl.
*G06F 17/50*     (2006.01)
(52) U.S. Cl. ............................ 716/136; 716/104; 716/132
(58) Field of Classification Search ................... 716/104, 716/132, 136
See application file for complete search history.

(56) References Cited

U.S. PATENT DOCUMENTS

| | | | |
|---|---|---|---|
| 6,086,626 A | 7/2000 | Jain et al. | |
| 6,163,876 A | 12/2000 | Ashar et al. | |
| 6,301,687 B1 | 10/2001 | Jain et al. | |
| 6,591,402 B1 * | 7/2003 | Chandra et al. | 716/5 |
| 6,904,578 B2 | 6/2005 | Jain et al. | |
| 6,944,838 B2 | 9/2005 | McMillan | |
| 7,149,987 B2 | 12/2006 | Zhu et al. | |

OTHER PUBLICATIONS

Clarke et al., Counterexample-Guided Abstraction Refinement, International Conference on Computer-Aided Verification, 2000, pp. 154-169.

Tat, Binh—Notice of Allowability, U.S. Appl. No. 12/013,163, dated Feb. 17, 2010.

Office Action mailed on Jul. 27, 2009 for U.S. Appl. No. 12/013,163, filed Jan. 11, 2008 entitled "Enhanced Verification by Closely Coupling a Structural Overapproximation Algorithm and a Structural Satisfiability Solver (as Amended)".

* cited by examiner

*Primary Examiner* — Thuan Do
(74) *Attorney, Agent, or Firm* — Dillon & Yudell LLP

(57) ABSTRACT

A method, system and computer program product for performing verification are disclosed. A first abstraction of an initial design netlist containing a first target is created and designated as a current abstraction, and the current abstraction is unfolded by a selectable depth. A composite target is verified using a satisfiability solver, and in response to determining that the verifying step has hit the composite target, a counterexample to is examined to identify one or more reasons for the first target to be asserted. One or more refinement pairs are built by examining the counterexample, and a second abstraction is built by composing the refinement pairs. One or more learned clauses and one or more invariants to the second abstraction and the second abstraction is chosen as the current abstraction. The current abstraction is verified with the satisfiability solver.

8 Claims, 3 Drawing Sheets

ENHANCED VERIFICATION BY CLOSELY COUPLING A STRUCTURAL OVERAPPROXIMATION ALGORITHM AND A STRUCTURAL SATISFIABILITY SOLVER

PRIORITY CLAIM

The present application is a continuation of U.S. patent application Ser. No. 11/340,477, filed on Jan. 26, 2006, now U.S. Pat. No. 7,356,792 and entitled, "Method and System for Enhanced Verification by Closely Coupling a Structural Overapproximation Algorithm and a Structural Satisfiability Solver," which is incorporated herein by reference.

This application is co-related to U.S. patent application Ser. No. 11/340,534, filed on even date herewith, and entitled, "METHOD AND SYSTEM FOR PERFORMING UTILIZATION OF TRACES FOR INCREMENTAL REFINEMENT IN COUPLING A STRUCTURAL OVERAPPROXIMATION ALGORITHM AND A SATISFIABILITY SOLVER", the contents of which are incorporated herein by reference.

BACKGROUND OF THE INVENTION

1. Technical Field

The present invention relates in general to verifying designs and in particular to reducing resource consumption during verification. Still more particularly, the present invention relates to a system, method and computer program product for performing verification by closely coupling a structural overapproximation algorithm and a structural satisfiability solver.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process.

Among the available verification techniques, formal and semiformal verification techniques are powerful tools for the construction of correct logic designs. Formal and semiformal verification techniques offer the opportunity to expose some of the probabilistically uncommon scenarios that may result in a functional design failure, and frequently offer the opportunity to prove that the design is correct (i.e., that no failing scenario exists).

Unfortunately, the resources needed for formal verification, or any verification, of designs are proportional to design size. Formal verification techniques require computational resources which are exponential with respect to the design under test. Simulation scales polynomially and emulators are gated in their capacity by design size and maximum logic depth. Semi-formal verification techniques leverage formal algorithms on larger designs by applying them only in a resource-bounded manner, though at the expense of incomplete verification coverage. Generally, coverage decreases as design size increases. Overapproximation is frequently used to reduce the size of a design in order to increase verification coverage.

Unfortunately, the prior art provides only limited tools for the merger of various verification techniques. Specifically, the prior art does not provide an effective method for tightly and synergistically coupling a structural overapproximation algorithm for reducing the size of a sequential design to a structural satisfiability (SAT) solver.

SUMMARY OF THE INVENTION

A method, system and computer program product for performing verification are disclosed. A first abstraction of an initial design netlist containing a first target is created and designated as a current abstraction, and the current abstraction is unfolded by a selectable depth. A composite target is verified using a satisfiability solver, and in response to determining that the verifying step has hit the composite target, a counterexample to is examined to identify one or more reasons for the first target to be asserted. One or more refinement pairs are built by examining the counterexample, and a second abstraction is built by composing the refinement pairs. One or more learned clauses and one or more invariants to the second abstraction and the second abstraction is chosen as the current abstraction. The current abstraction is verified with the satisfiability solver.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention provides a method, system and computer program product for enhanced verification by closely coupling a structural overapproximation algorithm and a structural satisfiability solver. The present invention employs transformation-based verification to enable the use of multiple algorithms, encapsulated as engines of a modular multiple-engine-based verification system to synergistically simplify and decompose complex problems into simpler sub-problems which are easier to formally discharge. More specifically, the present invention provides a novel method for tightly and synergistically coupling a structural overapproximation algorithm for reducing the size of a sequential design to a structural satisfiability (SAT) solver, enabling reductions to be completed much faster than possible under the prior art. The presented technique results in drastic savings in computational resources for the verification process, enabling design flaws to be exposed and proofs to be completed that otherwise would be infeasible using available resources (e.g., time and memory).

Figure 1:
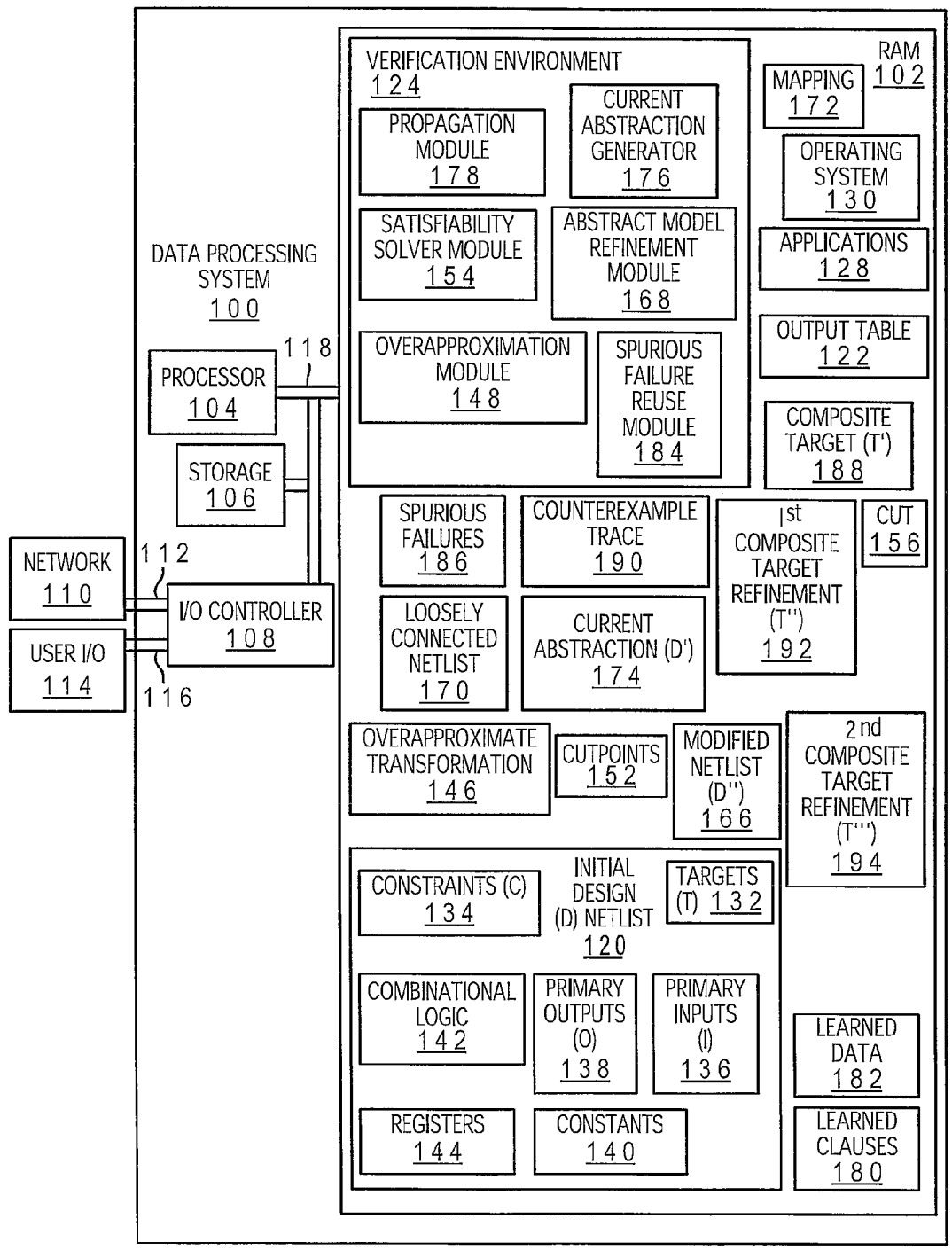
FIG. 1 depicts a block diagram of a general-purpose data processing system with which the present invention of a method, system and computer program product for performing verification by closely coupling a structural overapproximation algorithm and a structural satisfiability solver may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include an initial design (D) netlist 120 and an output table 122 for interaction with a verification environment 124. In the embodiment shown in FIG. 1, initial design (D) netlist 120 contains targets (T) 132, constants 140, combinational logic 142, registers 144, primary inputs (I) 136, primary outputs (O) 138 and constraints (C) 134. Other applications 128 and verification environment 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other items in RAM 102 include an overapproximate transformation 146, a set of cutpoints 152, a composite target (T') 188, a counterexample trace 190, a modified netlist (D") 166, a loosely connected netlist 170, learned data 182, learned clauses 180, a cut 156 and a current abstraction (D') 174. Verification environment 124 includes a propagation module 178, an overapproximation module 148, an abstract model refinement module 168, a spurious failure reuse module 184, a current abstraction generator 176 and a satisfiability solver module 154.

A netlist graph, such as initial design (D) netlist 120, is a popular means of compactly representing problems derived from circuit structures in computer-aided design of digital circuits. Such a representation is non-canonical and offers the ability to analyze the function of circuits from the nodes in initial design (D) netlist 120. Initial design (D) netlist 120 contains a directed graph with vertices representing gates, and edges representing interconnections between those gates. The gates have associated functions, such as constants 140, primary inputs (I) 136 (hereafter also referred to as RANDOM gates), combinational logic 142 such as AND gates, and sequential elements (hereafter referred to as registers 144).

In a preferred embodiment, the method of the present invention is applied to a representation of initial design (D) netlist 120 in which the only combinational gate type within combinational logic 142 is a 2-input AND, and inverters are represented implicitly as edge attributes. Registers 144 have two associated components: their next-state functions, and their initial-value functions. Both are represented as other gates in the graph of initial design (D) netlist 120. Semantically, for a given register 144, the value appearing at its initial-value gate at time, '0' ("initialization" or "reset" time) will be applied as the value of the register 144 itself, while the value appearing at its next-state function gate at time "i" will be applied to the register itself at time "i+1". Certain gates are labeled as targets (T) 132 and constraints (C) 134.

Targets (T) 132 represent nodes whose Boolean expressions are of interest and need to be computed. The goal of the verification process is to find a way to drive a '1' to a target (T) 132 node, or to prove that no such assertion of the target (T) 132 is possible. In the former case, a counterexample trace 190, which shows the sequence of assignments to the inputs in every cycle leading up to the fail event, is generated and recorded to output table 122. Constraints (C) 134 are used to "artificially" limit the stimulus that can be applied to the primary inputs (I) 136 (RANDOM gates) of initial design (D) netlist 120. For instance, a constraint (C) 134 could state that, when searching for a path to drive a '1' to a target (T) 132, verification environment 124 must adhere to the rule that "every constraint (C) 134 gate must evaluate to a logical 1 for every time-step up to, and including, the time-step at which the target is asserted". In such a case, valuations of primary inputs (I) 136 for which the constraint (C) 134 gate evaluates to a '0' are considered invalid.

The directed graph of initial design (D) netlist 120 imposes a topological order amongst the nodes representing any combinational logic of initial design (D) netlist 120. This topological ordering is necessary to avoid the creation of cycles in initial design (D) netlist 120, the creation of which would be semantically unsound. For example, in a 2-input AND/INVERTER representation, verification environment 124 imposes a rule of ordering that the node index of any node is greater than the indices of any of its children. Hence, variables typically tend to assume lower indices compared to AND gates in any combinational logic block within initial design (D) netlist 120. This tendency also implies that, if the variable of initial design (D) netlist 120 under scrutiny is to be composed with a logic cone of initial design (D) netlist 120, e.g., when constraining the values that the variable of initial design (D) netlist 120 can assume by replacing the variable of initial design (D) netlist 120 with a piece of logic that produces the constrained values, a large portion of the nodes in the recursive combinational fanout of the variable within initial design (D) netlist 120 will likely need to be recreated to maintain the topological ordering.

A cut 156 of initial design (D) netlist 120 represents a partition of initial design (D) netlist 120 into two graphs, where the only directed path from gates in the "source" graph of initial design (D) netlist 120 to the "sink" graph of initial design (D) netlist 120 flow through the gates comprising cut 156.

An overapproximate transformation 146 is one that may add randomness to the behavior of initial design (D) netlist 120. For example, if overapproximation module 148 injects a set of cutpoints 152 into a initial design (D) netlist 120 by replacing arbitrary gates in initial design (D) netlist 120 by RANDOM gates, the result is generally overapproximate, because the cutpoints 152 behave as completely random sources and hence can 'simulate' any possible behavior of the original gates being replaced in initial design (D) netlist 120. Those original gates in initial design (D) netlist 120 cannot necessarily produce some of the behavior that the RANDOM gates introduced as part of cutpoints 152 can produce. A spurious failure within spurious failures 186 refers to the condition where an overapproximate transformation 146 of the design under test causes a failure logged in output table 122 that would not be possible without the overapproximation.

Overapproximation module 148 operates by injection of cutpoints 152 to create modified netlist (D") 166. In a preferred embodiment, overapproximation module 148 eliminates significant portions of initial design (D) netlist 120 by effectively isolating a cut 156 of the initial design (D) netlist 120 and injecting cutpoints 152 (i.e., RANDOM gates) to those cut gates, causing the source side of cut 156 to drop out of the cone of influence of (i.e., the set of gates which fan out to) targets (T) 132. Overapproximation module 148 is deployed in a manner which explicitly seeks to eliminate sequential logic from initial design (D) netlist 120. In a preferred embodiment, this cutpoint 152 selection process uses a form of design analysis to ensure that the cutpoints 152 being inserted do not render spurious failures 186, while still overapproximating the behavior of initial design (D) netlist 120. For example, a preferred embodiment may perform "localization refinement", which consists of injecting cutpoints 152 and running underapproximate verification to attempt to assess whether the cutpoints 152 cause spurious failures 186. If the underapproximate verification causes spurious failures 186, then overapproximation module 148 can refine the cutpoints 152 by eliminating them from cut 156 and re-inserting them further back in the fanin cone of the earlier cutpoints 152 to attempt to eliminate the corresponding spurious failure 186.

Satisfiability solver module 154 operates directly on an AND/INVERTER netlist representation in modified netlist (D") 166, allowing a tight integration of BDD-sweeping and simulation. Satisfiability solver module 154 implements a Davis-Putnam procedure, which, when implemented on modified netlist (D") 166, attempts to find a consistent set of value assignments for the vertices of modified netlist (D") 166 such that the target (T) 132 vertices evaluate to a set of 1s. Satisfiability solver module 154 includes three main steps: Imply, Decide, and Backtrack. The "Imply" step executed by satisfiability solver module 154 propagates all implications based on the current variable assignments within modified netlist (D") 166. For example, a logical '1' at the output of an AND gate in modified netlist (D") 166 implies that all its inputs within modified netlist (D") 166 must also assume a logical '1' value, and a logical '0' at any input of an AND gate implies that the output within modified netlist (D") 166 must also assume a logical '0' value. Once all implications by satisfiability solver module 154 have been made within modified netlist 166, satisfiability solver module 154 performs a "Decide" step, in which satisfiability solver module 154 selects a variable within modified netlist (D") 166, which not yet assigned, and assigns a value (logical '0' or logical '1') to it. The assignment within modified netlist (D") 166 is made and the "Imply" step is repreated.

Satisfiability solver module 154 process repeats these "inply" and "Decide" steps until all variables within modified netlist (D") 166 are assigned or a conflict is detected. For example, if all inputs of an AND gate are logical '1' but the output is required to be logical '0', satisfiability solver module 154 must backtrack to 'undo' a previous decision. Satisfiability solver module 154 analyzes the conflict to identify the earliest decision responsible for the conflict (through non-chronological backtracking) and records the condition(s) leading to the conflict in the form of a learned clause within learned clauses 180, which can reduce the number of cases that must be explicitly enumerated by satisfiability solver module 154. This reduction feature greatly improves the performance of verification environment 124. Unsatisfiability is proven by satisfiability solver module 154 if an exhaustive evaluation does not uncover an assignment requiring backtracking. Additionally, satisfiability solver module 154 attempts to simplify modified netlist (D") 166 as it learns certain invariant behaviors of modified netlist (D") 166 during processing. For instance, if satisfiability solver module 154 can determine that two nodes are equivalent, satisfiability solver module 154 will merge them to simplify subsequent analysis.

The present invention enables a close coupling of satisfiability solver module 154 overapproximation module 148 to intertwine them natively and achieve maximal synergy between the two algorithms resulting in dramatically improved performance.

Overapproximation module 148 uses a method to efficiently represent a structural abstraction refinement in modified netlist (D") 166. Typically, the topological order imposed on initial design (D) netlist 120 representation requires that, for subsequent abstract models inferred from analyzing the cause of a spurious hit obtained on a previous abstraction, the previous abstract model must be discarded, and a new refined model built, followed by subjecting it to analysis by satisfiability solver module 154. In particular, refinement traditionally consists of composing logic onto cutpoints 152; because the logic composed cutpoints 152 is created after the cutpoints 152, this composed logic is likely to have a higher index than the onto cutpoints 152 themselves, which violates topological ordering rules. Performing such a composition step under the described topological order restriction associated with initial design (D) netlist 120 thus requires reforming a large portion of the logic in modified netlist (D") 166 in order to maintain the topological order of initial design (D) netlist 120.

The discarding of the prior abstract model discussed above implies that all the information gathered on previous abstractions, such as equivalent nodes or learned clauses, is lost and will have to be rediscovered in the new abstract model. In the present invention, verification environment 124 improves upon the previously existing lossy scheme by using abstract model refinement module 168 to create loosely connected netlist 170, which includes the logic to be inserted for each of the cutpoints 152 to be refined, but abstract model refinement module 168 does not perform the actual composition. To compensate for the effect of abstract model refinement module 168, verification environment 124 maintains a mapping 172 between the cutpoints 152 to be refined and the output node of the logic created in loosely connected netlist 170. Verification environment 124 in effect, creates two netlists, in which loosely connected netlist 170 is a netlist (the "composed logic") that consists of a number of relatively small disconnected pieces of logic each with a "sink gate" representing the logic to be inserted for the cutpoints 152 in mapping 172, and mapping 172 is a mapping between the cutpoints 152 (RANDOM gates) of initial design (D) netlist 120 (the "prior abstraction") and the sink gates in the composed-logic of loosely connected netlist 170 that represent the logic feeding the respective cutpoints 152. This pair of netlists, hereafter referred to as the "refinement pair," collectively contains all the logic representing the abstract model of initial design (D) netlist 120 at any given stage of analysis by over-approximation module 148, though it is not actually connected together to form an actual current abstract netlist.

Verification environment 124 uses current abstraction generator 176 to optimally create a current abstraction (D') 174 from the loosely connected netlist 170 and mapping 172 to which to apply satisfiability solver module 154. To enable the application of satisfiability solver module 154 to loosely connected netlist 170 and mapping 172, verification environment 124 creates a single netlist in the form of current abstraction (D') 174 by traversing loosely connected netlist 170 and mapping 172 and effectively composing cutpoints 152 to be refined in the prior abstraction of initial design (D) netlist 120 with their corresponding sink gates in the logic composed onto cutpoints 152. This creation by current abstraction generator 176 is performed using a recursive fanin-in sweep. Starting from the targets (T) 132 under verification in the prior abstraction of initial design (D) netlist 120, current abstraction generator 176 works through initial design (D) netlist 120 fanin-wise to accommodate any gates which have not been created in the current abstraction (D') 174.

For example, when traversing through an AND gate, current abstraction generator 176 recurses to its fanin gates. When traversing through a cutpoint 152 to be refined, current abstraction generator 176 traverses to its sink gate in the composed logic. When current abstraction generator 176 encounters a gate with no fanin edges (e.g., a RANDOM gate which is not to be refined, or a constant gate), current abstraction generator 176 creates corresponding gate of the same type in current abstraction (D') 174. When current abstraction generator 176 returns from this recursion through gates which have multiple fanin gates (e.g., returning from traversing the fanin gates of an AND gate), current abstraction generator 176 creates a gate of the corresponding type in current abstraction (D') 174, whose fanin gates are the previously, recursively-created gates corresponding to the children of the current AND gate. When building the current abstraction (D') 174, current abstraction generator 176 maintains the mapping between the refinement pair (of loosely connected netlist 170 and mapping 172) and current abstraction (D') 174 for subsequent use by verification environment 124.

A non-obvious significant benefit of the use of current abstraction generator 176 is found in the fact that any merging performed by satisfiability solver module 154 on a prior abstraction is preserved and represented in current abstraction (D') 174 during the passing scheme employed by verification environment 124. In prior art approaches, such merging would need to be performed anew (at significant computational expense) by re-running satisfiability solver module 154 on a new abstract netlist.

A propagation module 178 propagates learned clauses 180 and other learned data 182 from the refinement pair (of loosely connected netlist 170 and mapping 172) to current abstraction (D') 174. As explained above, satisfiability solver module 154 identifies and stores learned clauses, which record the reasons for a particular conflict and help to reduce the number of cases the satisfiability solver module 154 needs to examine by pruning portions of the search space within initial design (D) netlist 120 that were found not to contain a solution in the past. This data is stored in learned clauses 180 in terms of the prior abstraction netlist of the refinement pair (of loosely connected netlist 170 and mapping 172).

Propagation module 178 enables verification environment 124 to reuse learned clauses 180 between subsequent invocations of satisfiability solver module 154 across refinements by transposing those learned clauses 180 in terms of current abstraction (D') 174, on which satisfiability solver module 154 is to be invoked. Note that subsequent abstractions represent progressively less overapproximate versions of initial design (D) netlist 120. Hence, learned clauses 180 discovered by satisfiability solver module 154 on any abstraction are applicable to future abstractions. Typically, the logic that is refined in subsequent abstractions represents a progressively smaller portion of the overall abstraction such that learned clauses from the previous invocations of the satisfiability solver module 154. Learned clauses 180 often prove useful in verifying current and future abstractions using satisfiability solver module 154.

Unfortunately, because, as explained above, current abstraction generator 176 creates current abstraction (D') 174 as a new netlist, learned clauses 180 from past iterations are not directly reusable under the prior art. In the present invention, propagation module 178 "transposes" learned clauses 180 from the prior abstraction to current abstraction (D') 174 using mapping 172. In particular, for each learned clause 180 in terms of the prior abstraction, propagation module 178 uses mapping 172 to convert that learned clause 180 in terms of the current abstraction (D') 174, which may then be used by satisfiability solver module 154 in analyzing current abstraction (D') 174. Propagation module 178 uses a similar scheme to propagate arbitrary learned data 182 across iterations of satisfiability solver module 154 to the current abstraction (D') 174. For example, invariants that have been learned about the prior abstraction (such as gate equivalences or implications) may form part of learned data 182.

Propagation module 178 and current abstraction generator 176 individually and collectively encourage substantially faster convergence on a solution by satisfiability solver module 154. Propagation module 178 and current abstraction generator 176 enable the satisfiability solver module 154 to reuse results from previous runs of satisfiability solver module 154 against current abstraction (D') 174. Prior art techniques would require that learned clauses 180 and learned data 182 be rederived at a significant computation cost. Given that thousands of refinements may be needed on a difficult problem before a solution is converged upon, the present invention's satisfiability solver module 154, propagation module 178 and current abstraction generator 176 combine to generate performance improvements of several orders of magnitude.

Note that upon generating a spurious failure 186 (counterexample trace 190) on current abstraction (D') 174, verification environment 124 cycles iteratively and verification environment 124 becomes the prior abstraction, which along with the composed logic to be added to eliminate the cause of the spurious failure 186 forms the new refinement pair. The prior refinement pair is then discarded. Because the new refinement pair contains a superset of learned clauses 180, mergings, invariants, etc. (as compared to the prior refinement pair) by inheriting that of the prior refinement pair and possibly more such data, the present invention provides a lossless framework for optimally reusing information from satisfiability solver module 154 across refinements.

Spurious failure reuse module 184 optimally reuses counterexample traces 190 representing spurious failures 186 obtained on the prior abstract netlist to simplify the task of verifying current abstraction (D') 174.

Typically, the refined logic at a cutpoint 152, i.e., the logic to be composed onto a cutpoint 152, is not very complex and might span just a few levels of logic. This simplicity is caused by the fact that most refinement schemes only identify the cutpoints 152 to be refined (i.e., those causing the spurious failure 186), and defer the task of identifying "how much logic to compose onto those cutpoints 152 to fully eliminate future related spurious failures 186" to future refinement stages. Furthermore, for optimality, it is desired to compose as little logic as possible for cutpoints 152, the assumption being that, if "more than necessary" logic is composed, current abstraction (D') 174 becomes larger than necessary, which defeats the primary purpose of use of overapproximation module 148 to yield as small a netlist as possible to ensure a proof of the targets (T) 132.

Rather than attempting to repeat falsifation of targets (T) 132 on current abstraction (D') 174, which, even given the inheritance of learned clauses 180 and learned data 182, frequently represents a formidable computation, spurious failure reuse module 184 attempts to quickly re-justify in current abstraction (D') 174 the prior counterexample trace 190 represented by a spurious failure 186. In particular, spurious failure reuse module 184 attempts to ascertain whether the same sequence of valuations to cutpoints 152 (from the prior abstraction) exists in the logic of current abstraction (D') 174. Spurious failure reuse module 184 performs a check of whether the composed logic being refined may evaluate to the same sequence as the prior cutpoints 152. Because the composed logic tends to be very small (independent of the overall size of current abstraction (D') 174), spurious failure reuse module 184 tends to perform very quickly. If a check of whether the composed logic being refined may evaluate to the same sequence as the prior cutpoints 152 is satisfiable, a new refinement phase may be triggered from the resulting counterexample trace 190 with no need to attempt to solve the overall target (T) 132 in the current abstraction (D') 174. The resulting counterexample trace 190 implies an assertion of target (T) 132 in current abstraction (D') 174. If no spurious failure 186 with a resulting counterexample trace 190 is obtained, spurious failure reuse module 184 proceeds to attempt to assert target (T) 132 in current abstraction (D') 174 (as the inability to satisfy the foregoing check does not imply that target (T) 132 itself cannot be asserted).

In addition to often rendering a faster counterexample trace 190, use of spurious failure reuse module 184 also tends to render higher-quality abstractions (e.g., including less logic) because verification environment 124 effectively concentrates on trying to eliminate completely the reasons for failure of overapproximation module 148 with respect to the prior spurious failure 186 along the current refined portion of the logic, as opposed to jumping back and forth between different regions of the design and different "types" of spurious counterexample traces 190. Because fresh calls to the satisfiability solver module 154 to verify new abstractions from scratch are likely to return unrelated cutpoints 152 to refine in subsequent calls, the use of spurious failure reuse module 184 creates increased efficiency. Note additionally that the former use of satisfiability solver module 154 is not necessarily a form of wasted overhead in this case as it is likely to learn useful clauses that prevent the satisfiability solver module 154 from searching for the corresponding path when attempting to solve target (T) 132 in current abstraction (D') 174.

Each of the modules described above has resulted in significant performance improvements in both speed and capacity. The present invention is able to complete proofs on designs which were impossible under the prior art. The following pseudocode, in which satisfiability solver module 154 is represented as SAT, outlines an embodiment of useful aspects of the present invention:

1. Algorithm localize (Netlist N, Target T)
2. Choose an initial abstraction of the netlist N, say N', by inserting cutpoints into the N
3. label: incremental_abstraction:
4. Unfold the abstraction N' for K (>0) number of steps and verify the composite unfolded target T' using the structural SAT-solver. Note that T' is obtained by ORing the copy of the target T in each step of the unfolding
5. If the target T' is hit {
6. label: incremental refinement:
7. Examine the counterexample trace returned by SAT to identify reasons for the target being asserted, i.e. cutpoints that should be refined. Call these C
8. Build the refinement pair as per aspect (1) of the invention, using the prior netlist as the prior abstraction and the logic to be refined onto that prior abstraction as the composed logic.
9. Build the current abstraction N" based from the refinement pair using aspect (2) of this invention. This step effectively moves the identified cutpoints C back in the fanin-cone of the prior abstraction.
10. Port over any learned clauses and invariants from the previous run of the structural SAT-solver on the prior abstraction N' to the SAT problem for the current abstraction N" obtained in the previous step, as per aspect (3) of this invention. These learned facts are applicable to the new problem instance N"—as N' is an overapproximation of N"
11. Obtain a subproblem by creating a target T" that is asserted when each of the cutpoints C is assigned a value that it assumed in the spurious counterexample from the last SAT call on abstraction N'. Hence, T" is a target over the cutpoints in N'. Note that this subproblem is much simpler than solving the unfolded target, Say T''', in the new abstraction N" since it only requires for SAT to solve the composed logic for the cutpoints C. This correlates to aspect (4) of this invention.

```
12.      N' = N"
13.      Verify T" using SAT
14.      If the target' is hit {
15.          Goto incremental_refinement
16.      } else {
17.          Verify T''' using SAT
18.          If the target T''' is hit {
19.              Goto incremental_refinement
20.          } else {
21.              Goto incremental_unfolding
22.          }
23.      }
24. } else {
25. label: incremental_unfolding:
26.      If the target T' proven unreachable, then increase K and Goto incremental_abstraction
27.      Otherwise, the SAT algorithm ran out of resources solving T';
return N' as the localized netlist
28. }
29.}
```

Note that, in the algorithm presented above, instead of an explicit unfolding approach with satisfiability solver module 154 applied to combinational unfolded netlists, this invention can be equally applied to sequential satisfiability solver module 154 packages by skipping the unfolding of step 4, and instead running the sequential satisfiability solver module 154 package for the chosen unfold depth of K.

Figure 2:
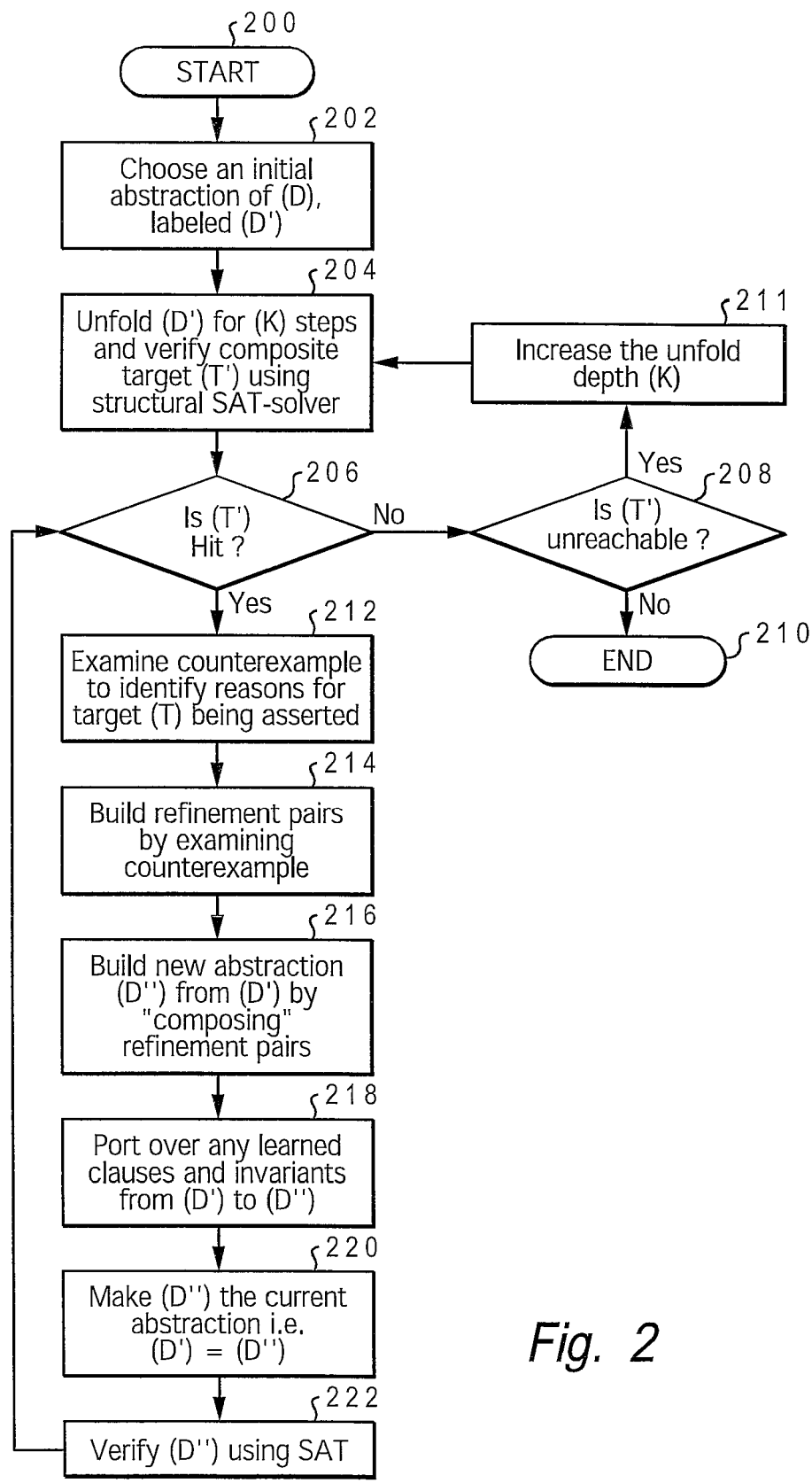
FIG. 2 is a high-level logical flowchart of a process for performing verification by closely coupling a structural overapproximation algorithm and a structural satisfiability solver.

Turning now to FIG. 2, a high-level logical flowchart of a process for performing verification by closely coupling a structural overapproximation algorithm and a structural satisfiability solver is depicted. The process starts at step 200 and then proceeds to step 202, which depicts verification environment 124 choosing an initial abstraction of initial design (D)

netlist 120 to serve as current abstraction (D') 174. The process next moves to step 204. At step 204, verification environment 124 unfolds current abstraction (D') 174 by an unfold depth (K) and verifies a composite target (T') 188, which is functionally equivalent to and substituted for target (T) 132, using satisfiability solver module 154. The process then proceeds to step 206, which illustrates verification environment 124 determining whether composite target (T') 188 is hit (or asserted). If verification environment 124 determines that composite target (T') 188 is not hit, the process next moves to step 208.

Step 208 depicts verification environment 124 determining whether composite target (T') 188 is unreachable. If verification environment 124 determines that composite target (T') 188 is not unreachable, then the process ends at step 210. If verification environment 124 determines that composite target (T') 188 is unreachable, then the process next proceeds to step 211, which illustrates verification environment 124 increasing unfold depth (K). The process then returns to step 204, which is described above.

Returning to step 206, if verification environment 124 determines that composite target (T') 188 is hit, then the process moves to step 212, which illustrates verification environment 124 examining counterexample trace 190 to identify reasons for target (T) 132 to be asserted. The process then proceeds to step 214. Step 214 depicts verification environment 124 building refinement pairs (of loosely connected netlist 170 and mapping 172) by examining counterexample trace 190. The process next moves to step 216, which illustrates verification environment 124 using overapproximation module 148 and abstract model refinement module 168 to build a new abstraction in the form of modified netlist (D") 166 by composing refinement pairs (of loosely connected netlist 170 and mapping 172). The process then proceeds to step 218.

Step 218 depicts verification environment 124 using propagation module 178 to 'port over' or propagate learned clauses 180 and other learned data 182 (e.g., invariants) from current abstraction (D') 174 to modified netlist (D") 166. The process next moves to step 220, which illustrates verification environment 124 setting modified netlist (D") 166 as the new current abstraction (D') 174. The process then proceeds to step 222. At step 222, verification environment 124 verifies modified netlist (D") 188 using satisfiability solver module 154. The process then returns to step 306.

Figure 3:
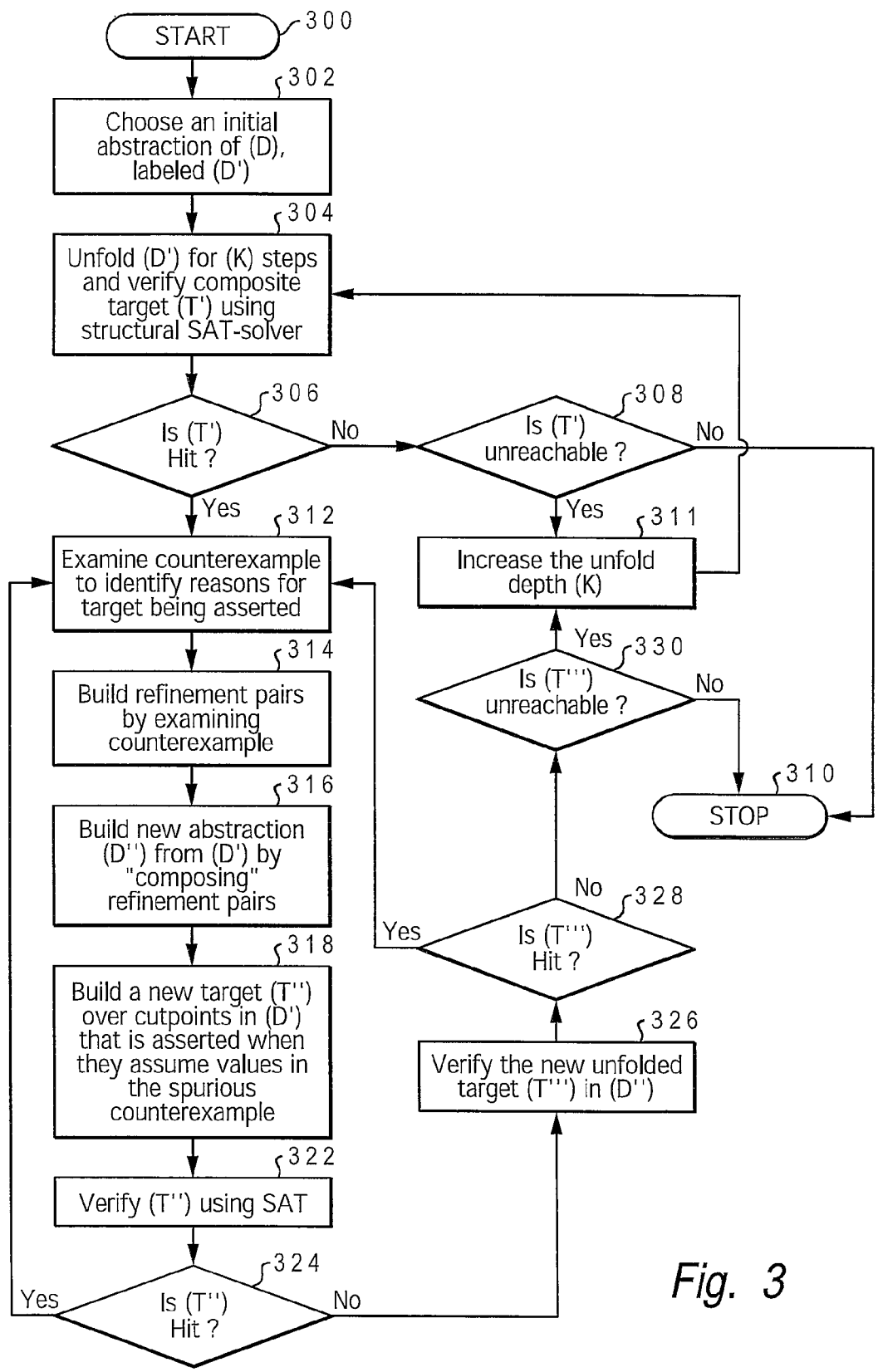
FIG. 3 is a high-level logical flowchart of a process for performing utilization of traces for incremental refinement.

Referring now to FIG. 3 a high-level logical flowchart of a process for performing utilization of traces for incremental refinement is depicted. The process starts at step 300 and then proceeds to step 302, which depicts verification environment 124 choosing an initial abstraction of initial design (D) netlist 120 to serve as current abstraction (D') 174. The process next moves to step 304. At step 304, verification environment 124 unfolds current abstraction (D') 174 by an unfold depth (K) and verifies a composite target (T') 188, which is functionally equivalent to and substituted for target (T) 132 using satisfiability solver module 154. The process then proceeds to step 306, which illustrates verification environment 124 determining whether composite target (T') 188 is hit (or asserted). If verification environment 124 determines that composite target (T') 188 is not hit, the process next moves to step 308.

Step 308 depicts verification environment 124 determining whether composite target (T') 188 is unreachable. If verification environment 124 determines that composite target (T') 188 is not unreachable, then the process ends at step 310. If verification environment 124 determines that composite target (T') 188 is unreachable, then the process next proceeds to step 311, which illustrates verification environment 124 increasing unfold depth (K). The process then returns to step 304, which is described above.

Returning to step 306, if verification environment 124 determines that composite target (T') 188 is hit, then the process moves to step 312, which illustrates verification environment 124 examining counterexample trace 190 to identify reasons for target (T) 132 to be asserted. The process then proceeds to step 314. Step 314 depicts verification environment 124 building refinement pairs (of loosely connected netlist 170 and mapping 172) by examining counterexample trace 190. The process next moves to step 316, which illustrates verification environment 124 using overapproximation module 148 and abstract model refinement module 168 to build a new abstraction in the form of modified netlist (D") 166 by composing refinement pairs (of loosely connected netlist 170 and mapping 172). The process then proceeds to step 318.

Step 318 depicts verification environment 124 building a first composite target refinement (T") 192 over cutpoints 152 in current abstraction (D') 174 that is asserted when cutpoints 152 assume values in spurious counterexample 190. The process then proceeds to step 322. At step 322, verification environment 124 verifies first composite target refinement (T") 192 using satisfiability solver module 154. The process then proceeds to step 324, which illustrates verification environment 124 determining whether first composite target refinement (T") 192 is hit (or asserted). If verification environment 124 determines that first composite target refinement (T") 192 is hit, the process returns to step 312, which is described above. If verification environment 124 determines that first composite target refinement (T") 192 is not hit, then the process next proceeds to step 326, which illustrates verification environment 124 verifying a new unfolded target in the form of $2^{nd}$ composite target refinement (T'") 194. The process then moves to step 328.

Step 328 illustrates verification environment 124 determining whether $2^{nd}$ composite target refinement (T'") 194 is hit (or asserted). If verification environment 124 determines that $2^{nd}$ composite target refinement (T'") 194 is not hit, the process next moves to step 330.

Step 330 depicts verification environment 124 determining whether $2^{nd}$ composite target refinement (T'") 194 is unreachable. If verification environment 124 determines that $2^{nd}$ composite target refinement (T'") 194 is not unreachable, then the process ends at step 310. If verification environment 124 determines that $2^{nd}$ composite target refinement (T'") 194 is unreachable, then the process next returns to step 311, which is described above. Returning to step 328, if verification environment 124 determines that $2^{nd}$ composite target refinement (T'") 194 is hit, then the process returns to step 312, which is described above.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A program product for verifying an integrated circuit design, said program product comprising:
   a non-transitory machine-readable medium; and
   a plurality of instructions processable by a machine embodied on the non-transitory machine-readable medium, wherein said plurality of instructions, when processed by said machine, causes said machine to perform:
      creating and designating as a current abstraction a first abstraction of an initial design netlist containing a first target;
      unfolding said current abstraction by a selectable depth;
      verifying a composite target using a satisfiability solver; and
      in response to determining that said verifying has hit said composite target, determining whether said composite target is unreachable;
      in response to determining whether said composite target is unreachable, increasing said selectable depth;
      in response to determining that said verifying step has hit said composite target:
         examining a counterexample to identify one or more reasons for said first target to be asserted, wherein said counterexample is a sequence of assignments to inputs of said current abstraction in every cycle leading up to a fail event;
         building one or more refinement pairs by examining said counterexample;
         building a second abstraction by composing said refinement pairs;
         porting one or more learned clauses and one or more invariants encountered during verification of said current abstraction to said second abstraction to facilitate verification of said second abstraction by said satisfiability solver by reducing a number of cases said satisfiability solver examines during said verification of said second abstraction;
         choosing as said current abstraction said second abstraction; and
         verifying said current abstraction with said satisfiability solver and outputting a result of the verifying.

2. The program product of claim 1, wherein said plurality of instructions further causes the machine to perform:
   forming said composite target from said first target.

3. The program product of claim 1, wherein said plurality of instructions further causes the machine to perform:
   generating said counterexample.

4. The program product of claim 1, wherein said building said one or more refinement pairs further comprises building a loosely connected netlist.

5. A data processing system comprising:
   a processor;
   data storage coupled to the processor; and
   a plurality of instructions processable by the processor and stored within the data storage, wherein said plurality of instructions, when processed by said processor, causes said data processing system to perform:
      creating and designating as a current abstraction a first abstraction of an initial design netlist containing a first target;
      unfolding said current abstraction by a selectable depth;
      verifying a composite target using a satisfiability solver; and
      in response to determining that said verifying has hit said composite target, determining whether said composite target is unreachable;
      in response to determining whether said composite target is unreachable, increasing said selectable depth;
      in response to determining that said verifying step has hit said composite target:
         examining a counterexample to identify one or more reasons for said first target to be asserted, wherein said counterexample is a sequence of assignments to inputs of said current abstraction in every cycle leading up to a fail event;
         building one or more refinement pairs by examining said counterexample;
         building a second abstraction by composing said refinement pairs;
         porting one or more learned clauses and one or more invariants encountered during verification of said current abstraction to said second abstraction to facilitate verification of said second abstraction by said satisfiability solver by reducing a number of cases said satisfiability solver examines during said verification of said second abstraction;
         choosing as said current abstraction said second abstraction; and
         verifying said current abstraction with said satisfiability solver and outputting a result of the verifying.

6. The data processing system of claim 5, wherein said plurality of instructions further causes the data processing system to perform:
   forming said composite target from said first target.

7. The data processing system of claim 5, wherein said plurality of instructions further causes the data processing system to perform:
   generating said counterexample.

8. The data processing system of claim 5, wherein said building said one or more refinement pairs further comprises building a loosely connected netlist.

* * * * *